United States Patent
Maruthamuthu et al.

(10) Patent No.: US 11,031,699 B2
(45) Date of Patent: Jun. 8, 2021

(54) ANTENNA WITH GRADED DIELECTIRC AND METHOD OF MAKING THE SAME

(71) Applicant: Intel IP Corporation, Santa Clara, CA (US)

(72) Inventors: Saravana Maruthamuthu, Munich (DE); Bernd Waidhas, Pettendorf (DE); Andreas Augustin, Munich (DE); Georg Seidemann, Landshut (DE)

(73) Assignee: Intel IP Corporation, Santa Clara, CA (US)

( * ) Notice: Subject to any disclaimer, the term of this patent is extended or adjusted under 35 U.S.C. 154(b) by 429 days.

(21) Appl. No.: 15/892,632

(22) Filed: Feb. 9, 2018

(65) Prior Publication Data

US 2019/0252792 A1 Aug. 15, 2019

(51) Int. Cl.
*H01Q 19/06* (2006.01)
*H01Q 15/08* (2006.01)
*H01L 23/66* (2006.01)
*H01L 23/528* (2006.01)
*H01L 23/498* (2006.01)
(Continued)

(52) U.S. Cl.
CPC ....... *H01Q 19/06* (2013.01); *H01L 21/32051* (2013.01); *H01L 21/4846* (2013.01); *H01L 21/56* (2013.01); *H01L 21/76802* (2013.01); *H01L 21/76877* (2013.01); *H01L 23/13* (2013.01); *H01L 23/49838* (2013.01); *H01L 23/528* (2013.01); *H01L 23/5226* (2013.01); *H01L 23/66* (2013.01); *H01L 24/11* (2013.01); *H01L 24/16* (2013.01); *H01L 24/81* (2013.01); *H01Q 1/48* (2013.01); *H01Q 15/08* (2013.01); *H01L 24/05* (2013.01); *H01L 2223/6616* (2013.01); *H01L 2223/6677* (2013.01); *H01L 2224/0401* (2013.01); *H01L 2224/0557* (2013.01); *H01L 2224/16227* (2013.01); *H01L 2224/81801* (2013.01); *H01L 2924/142* (2013.01)

(58) Field of Classification Search
None
See application file for complete search history.

(56) References Cited

U.S. PATENT DOCUMENTS 6,081,239 A * 6/2000 Sabet ............... H01Q 1/40
343/700 MS
6,509,880 B2 * 1/2003 Sabet ............... H01Q 1/40
343/700 MS (Continued)

OTHER PUBLICATIONS

Babakhani, Aydin, et al., "A 77-GHz Phased-Array Transceiver With On-Chip Antennas in Silicon: Receiver and Antennas", (Dec. 2006), 2795-2806.

*Primary Examiner* — Trinh V Dinh
(74) *Attorney, Agent, or Firm* — Schwegman Lundberg & Woessner, P.A.

(57) ABSTRACT

Some embodiments include packages and methods of making the packages. One of the packages includes a ground layer (e.g., a ground plane) of metal formed over a chip of die, an antenna element of metal formed over the ground layer, and a dielectric lens formed over the antenna element. The dielectric lens includes a plurality of dielectric layers that have graded dielectric constants in a decreasing order along a direction from the antenna element toward a top surface of the package.

12 Claims, 5 Drawing Sheets

(51) Int. Cl.
*H01L 23/522* (2006.01)
*H01L 23/00* (2006.01)
*H01L 21/56* (2006.01)
*H01L 21/3205* (2006.01)
*H01L 21/48* (2006.01)
*H01L 21/768* (2006.01)
*H01L 23/13* (2006.01)
*H01Q 1/48* (2006.01)

(56) References Cited

U.S. PATENT DOCUMENTS

| | | | |
|---|---|---|---|
| 9,472,838 B2* | 10/2016 | McKinzie, III | H01P 1/2005 |
| 2002/0057220 A1* | 5/2002 | Sabet | H01Q 1/40 |
| | | | 343/700 MS |
| 2006/0158377 A1* | 7/2006 | Hu | H01Q 1/38 |
| | | | 343/700 MS |
| 2008/0165079 A1* | 7/2008 | Smith | B82Y 20/00 |
| | | | 343/911 R |
| 2010/0141350 A1* | 6/2010 | Sasaki | H01L 23/66 |
| | | | 333/1.1 |
| 2010/0201465 A1* | 8/2010 | McKinzie, III | H01P 1/16 |
| | | | 333/251 |
| 2010/0219252 A1* | 9/2010 | Kikuchi | H01Q 1/2225 |
| | | | 235/488 |
| 2014/0110840 A1* | 4/2014 | Wojnowski | H01Q 23/00 |
| | | | 257/738 |
| 2019/0190142 A1* | 6/2019 | Nagaishi | H01Q 1/42 |

* cited by examiner

ANTENNA WITH GRADED DIELECTIRC AND METHOD OF MAKING THE SAME

TECHNICAL FIELD

Embodiments described herein pertain to integrated circuits. Some embodiments relate to antennas included in integrated circuits.

BACKGROUND

Millimeter wave antenna technology may facilitate shrinking of dimensions of on-chip antennas. In some cases, most of the radiated power of a conventional on-chip antenna is concentrated in silicon and less power is radiated outwards into the air, and thus the radiation efficiency of the on-chip antenna is reduced.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The techniques described herein include an IC package having an on-chip antenna. The on-chip antenna described herein can be used by many components of the IC device. An example of the components includes a transceiver, such as a transceiver used in wireless communication devices or systems.

A conventional on-chip antenna can be realized using thick metals over a silicon with a dielectric constant εr of about 11.7 for example. As a result, most of the radiated power of the on-chip antenna is concentrated in the silicon and less power is radiated outwards into the air, and thus resulting in a sacrifice of the radiation efficiency of the conventional on-chip antenna. To solve this problem, a ground plane of metal may be added in the on-chip antenna over the silicon, and an antenna element of metal may be fabricated on the topmost metal of the chip. In this way, the ground plane may reflect the electromagnetic radiation emanating from the on-chip antenna towards the silicon back into the air. However, this solution may limit the height of the separation between the on-chip antenna and the ground plane to a maximum of e.g., 15 μm, resulting in a high electromagnetic coupling, and may reduce the radiation resistance of the on-chip antenna (less than 0.1Ω), resulting in a low radiation efficiency (e.g., ~5%).

As discussed in more detail below, the described techniques include a package that includes an antenna element of metal (e.g., a millimeter wave antenna element, which is located in an upper redistribution layer (RDL) of metal) over a ground plane (which is located in a lower RDL of metal). The height of separation between the antenna element and the ground plane can be adjusted for a high radiation efficiency. A stack of graded dielectrics are assembled over the antenna element, with decreasing order of dielectric constants along a direction starting from the antenna element towards a top surface of the package. The stack of graded dielectrics thus forms a graded dielectric lens over the antenna element, such that the antenna element may have a good interface match to the air. The dielectric lens can also enhance the directivity of the antenna element. An opening (e.g., an open slot) can be cut into a printed circuit board (PCB) of the package such that the top dielectric of the stack of graded dielectrics of the dielectric lens may directly meet the air. The described techniques may be used in low power millimeter wave transceivers to improve their radiation efficiency, since the directivity of the antenna elements are enhanced by the graded dielectric lens over them. The described techniques also may shrink of transceiver blocks on chip. Moreover, the described techniques also may facilitate beam steering for 5G applications as the graded dielectric lens over the antenna enjoys high directivity.

Figure 1:
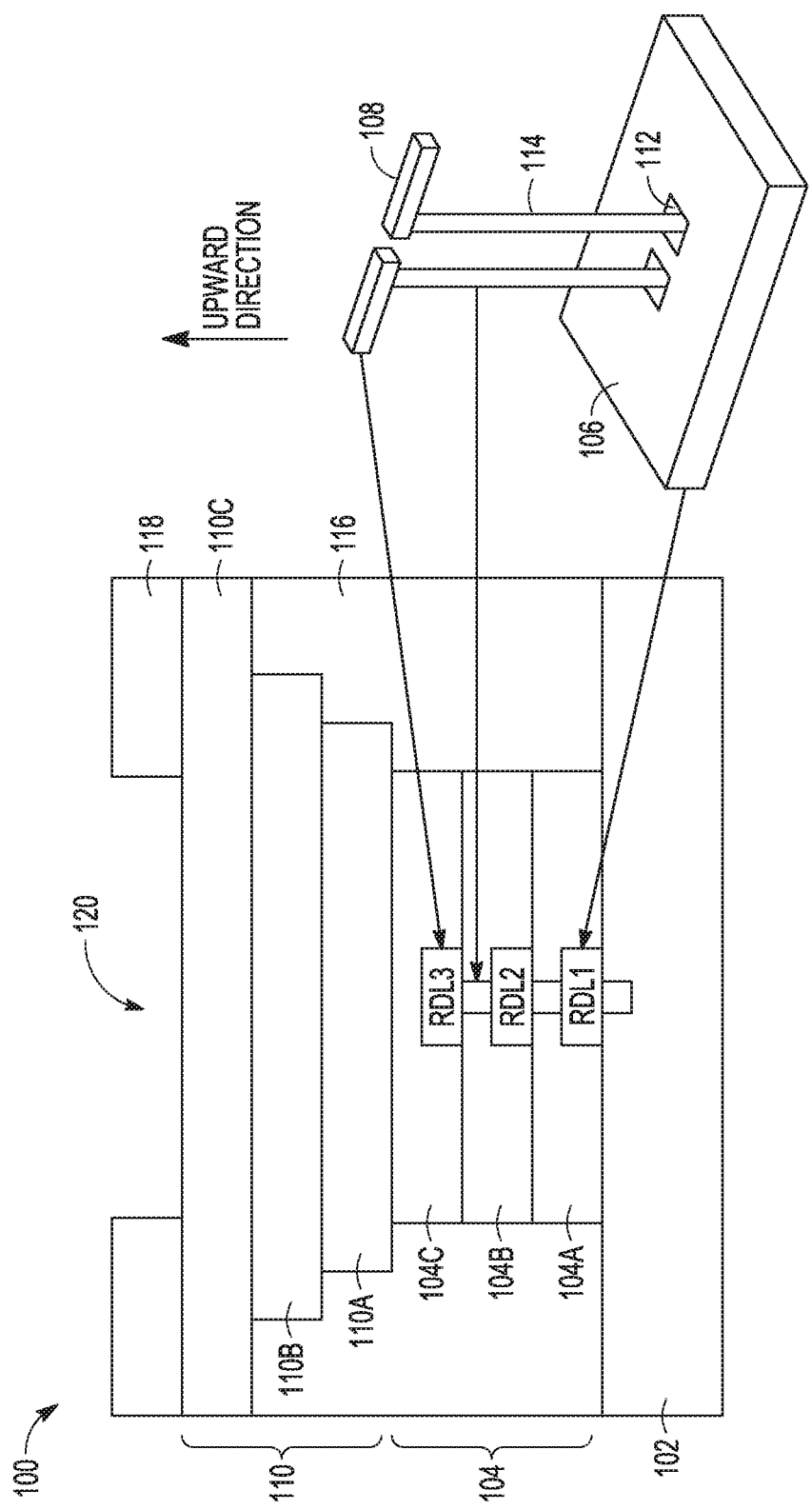
FIG. 1 is a cross-sectional side view diagram showing a package with an on-chip antenna according to some embodiments described herein.

FIG. 1 is a cross-sectional side view diagram showing a package 100 with an on-chip antenna element according to some embodiments described herein. The package 100 may include a chip 102 of die (for example, silicon), a spacer stack 104 of dielectric spacers (such as dielectric spacers 104A, 104B and 104C) over the chip 102, a ground layer (e.g., a ground plane) 106 of metal in a lower portion of the spacer stack 104, an antenna element 108 of metal in an upper portion of the spacer stack 104 and over the ground plane 104, and a dielectric lens 110 over the antenna element 108.

In some embodiments, the dielectric spacers (such as dielectric spacer 104A. 104B and 104C) of the spacer stack 104 may have a same dielectric constant (e.g., 4.0). As shown in FIG. 1, the ground plane 106 of metal may be formed in a first redistribution layer (RDL1) of metal in dielectric spacer 104A (which is in a lower portion of the spacer stack 104), and the antenna element 108 of metal may be formed in a third redistribution layer (RDL3) of metal in dielectric spacer 104C (which is in an upper portion of the spacer stack 104). The ground plane 106 of metal may shield the antenna element 108 electromagnetically from the chip 102 of die (e.g., silicon). The ground plane 106 also may help to reflect the electromagnetic (EM) radiation from the antenna element 108 back towards the air.

The spacer stack 104 may have one or more dielectric spacers (such as dielectric spacer 104B) between the dielectric spacer 104A at a lower portion of the spacer stack 104 and the dielectric spacer 104C at an upper portion of the spacer stack 104. The dielectric spacers such as dielectric spacer 104A, 104B and 104C of the spacer stack 104 may be typical package dielectrics. The heights of the dielectric spacers such as dielectric spacer 104A. 104B and 104C can be chosen to maximize the radiation efficiency of the on-chip antenna 108.

In some embodiments, the package 100 may include one or more through slots 112 in the ground plane 106, and one or more power lines 114 that pass through the through slots 112 in the ground plane 106 and electrically connect the chip 102 and the antenna element 108 to provide power from the chip 102 to the antenna element 108.

In some embodiments, the dielectric lens 110 may include a plurality of dielectric layers (such as 110A, 110B and 110C) that may have vertically graded dielectric constants along an upward vertical direction from the antenna element 108 toward a top surface of the package 100. In some embodiments, the dielectric constants k of the plurality of dielectric layers (such as 110A, 110B and 110C) of the dielectric lens 110 may be vertically graded in a decreasing order along the upward vertical direction from the antenna element 108 towards the top surface of the package 100. For example, the dielectric constant k of dielectric layer 110A of the dielectric lens 110 may be around e.g., 4.0, the dielectric constant k of dielectric layer 110B of the dielectric lens 110 may be around e.g., 3.0, and the dielectric constant k of dielectric layer 110C of the dielectric lens 110 may be around e.g., 2.2. In this way, the signal reflected off the ground plane 106 can be efficiently focused into the lens area of the dielectric lens 110, and thus the radiation efficiency of the antenna element 108 can be improved.

In some embodiments, horizontal dimensions (such as lengths and widths extending in a plane perpendicular to the upward vertical direction) of the plurality of dielectric layers (such as 110A, 110B and 110C) of the dielectric lens 110 may increase along the upward vertical direction from the antenna element 108 towards the top surface of the package 100. For example, the horizontal dimension of the dielectric layer 110B is greater than the horizontal dimension of the dielectric layer 110A, and the horizontal dimension of the dielectric layer 110C is greater than the horizontal dimension of the dielectric layer 110B, such that the dielectric lens 110 is formed in a taper shape with a top side broader than a bottom side. The dielectric lens 110 thus may enhance the directivity of the on-chip antenna element 108 towards the air on the top-side, and also may improve the interface match between air and antenna dielectric.

In some embodiments, the package 100 may include a mold compound 116 of dielectric over the chip 102 of die, wrapping around the spacer stack 104 and the dielectric lens 110. The dielectric constant k of the mold compound 116 may be around 4.0 for example.

In some embodiments, the package 100 may include a printed circuit board (PCB) 118 over the top surface of the package 100. The package 100 may also include an opening (e.g., a cut slot) 120 formed into the PCB 118 to expose a top surface of the dielectric lens 110. For example, as shown in FIG. 1, a top surface of the upmost dielectric layer such as the dielectric layer 110C of the dielectric lens 110 is directly exposed to the air by the opening 120 formed in the PCB 118 so that the dielectric lens 110 of the antenna element 108 may directly meet the air to maximize the radiation of the antenna element 108 outside towards the air and to minimize the interface mismatch.

Figure 2:
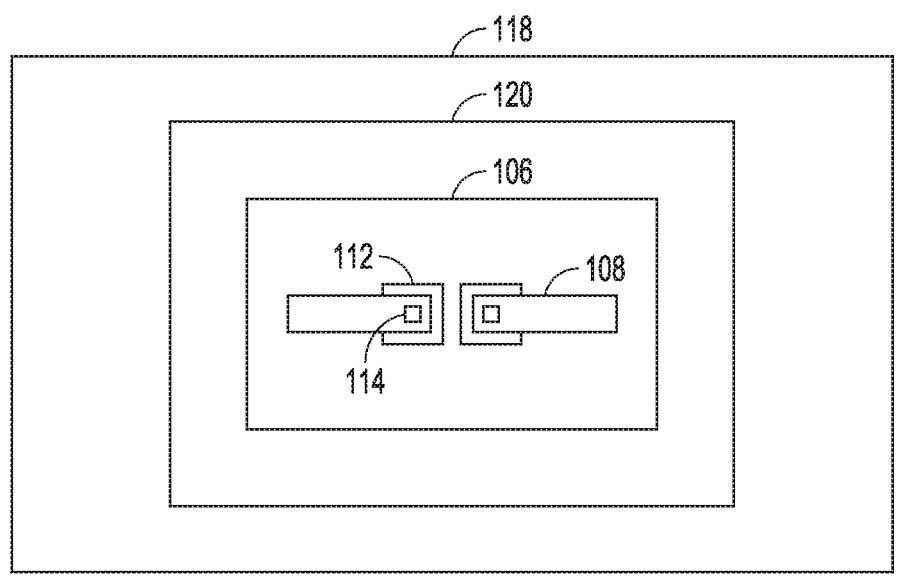
FIG. 2 is a top view of a package with an on-chip antenna and an opening formed in a printed circuit board according to some embodiments described herein.

FIG. 2 is a top view of the package 100 illustrating the on-chip antenna element 108 and the opening (e.g., a cut slot) 120 formed in the printed circuit board (PCB) 118 according to some embodiments described herein. The opening 120 in the PCB 118 may facilitate interface matching between the antenna element 108 and the air. As shown in FIG. 2, a horizontal dimension of the ground plane 106 is greater than a horizontal dimension of the antenna element 108, and a horizontal dimension of the opening 120 is greater than the horizontal dimension of the ground plane 106 and the horizontal dimension of the antenna element 108.

Figure 3:
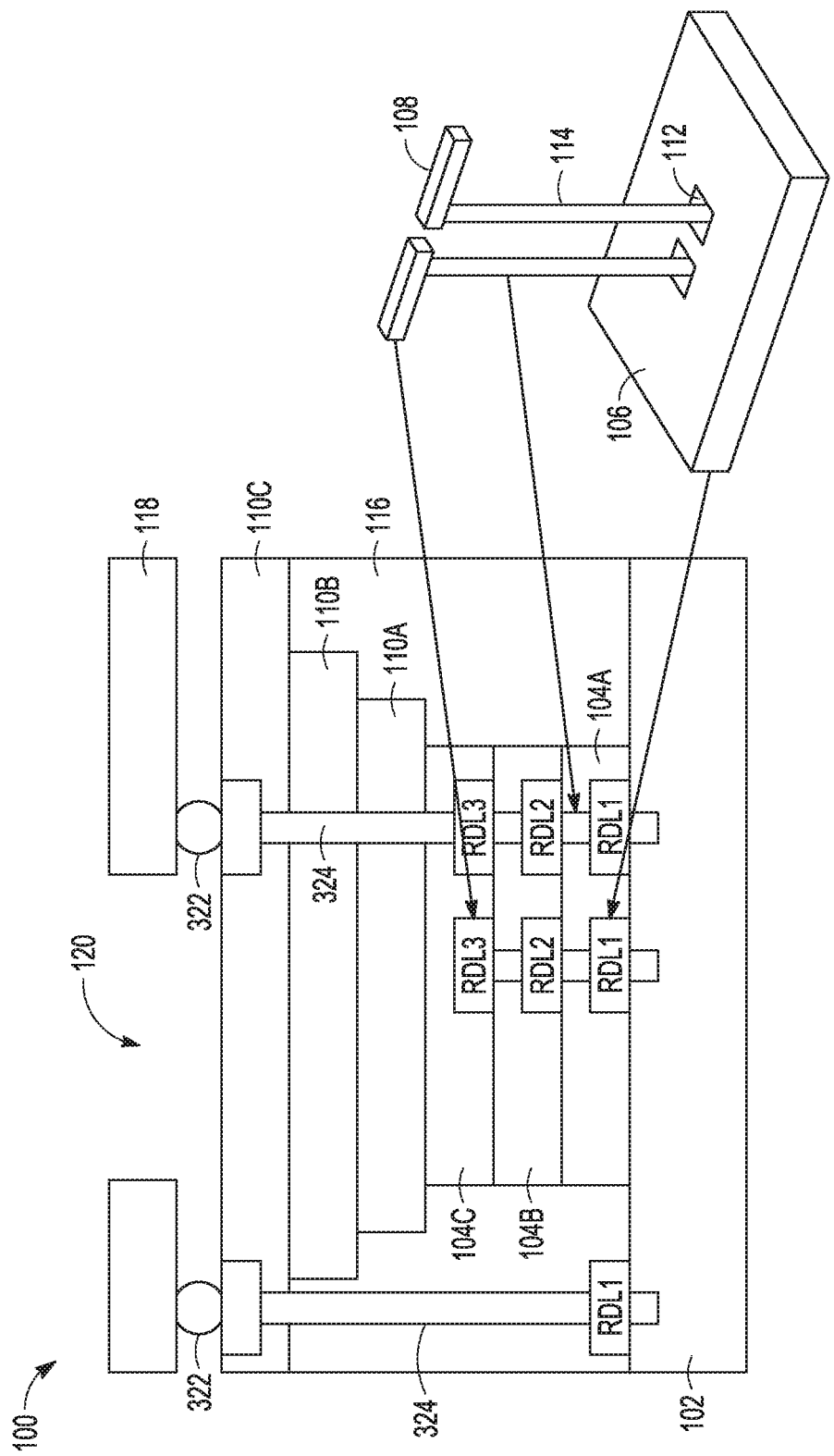
FIG. 3 is a cross-sectional side view diagram showing a package with an on-chip antenna and an arrangement of soldering the package to a printed circuit board according to some embodiments described herein.

FIG. 3 is a cross-sectional side view diagram illustrating the package 100 with the on-chip antenna element 108 and an arrangement of soldering the package 100 to the PCB 118 according to some embodiments described herein. Due to the opening 120 in the PCB 118, the package 100 can be soldered to the PCB 118 using solder balls 322 and through mold vias 324. In some embodiments, as shown in FIG. 3, through mold via 324 can run from RDL3 located in the dielectric spacer 104C, and through mold via 324 also can run directly from RDL1 located in the dielectric spacer 104A, while maintaining a keep-off distance from the antenna element 108 to avoid potential electromagnetic interaction or coupling between through mold via 324 and the antenna element 108.

Figure 4:
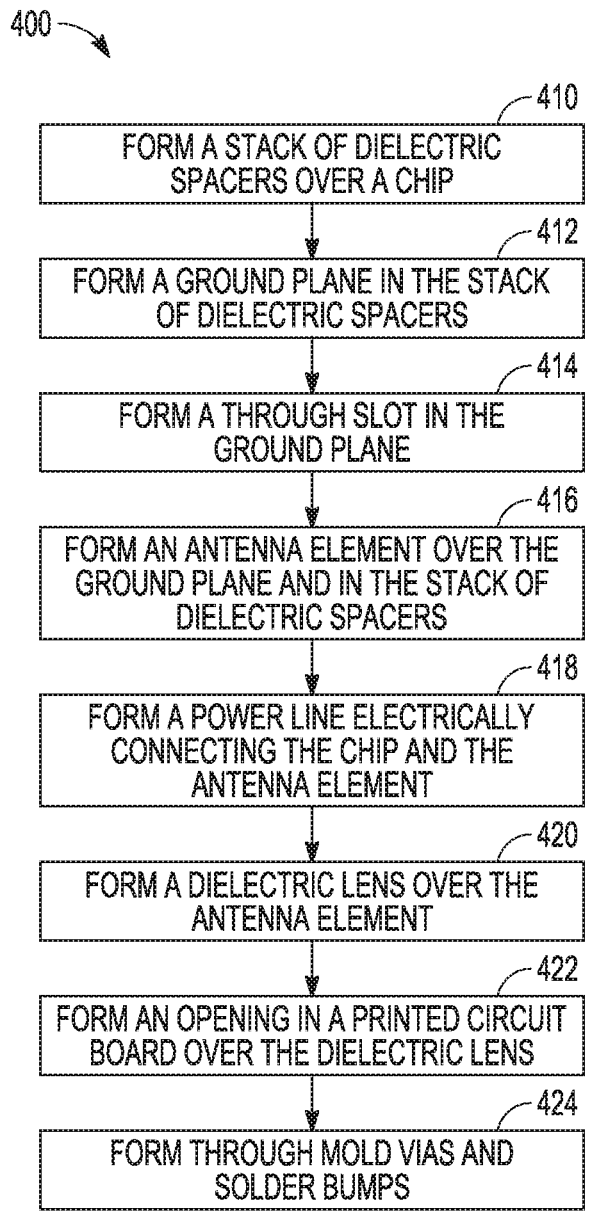
FIG. 4 is a process flow diagram of making a package with an on-chip antenna according to some embodiments described herein.

FIG. 4 is a process flow diagram illustrating a method 400 of making a package 100 with an on-chip antenna element 108 according to some embodiments described herein.

At 410, a dielectric spacer stack 104 is formed over a chip 102 of die (for example silicon). The dielectric spacer stack 104 may be formed to include a plurality of dielectric spacers (such as dielectric spacers 104A, 104B and 104C as shown in FIG. 1) over the chip 102. The dielectric spacers such as dielectric spacer 104A, 104B and 104C of the spacer stack 104 may be typical package dielectrics. The heights of the dielectric spacers such as the dielectric spacers 104A, 104B and 104C can be chosen to maximize the radiation efficiency of the on-chip antenna 108. For example, the height of the dielectric spacer stack 104 can be adjusted by adding or reducing the dielectric spacers to maximize the radiation efficiency of the antenna element.

At 412, a ground plane 106 of metal is formed in the dielectric spacer 104. As shown in FIG. 1, the ground plane 106 of metal is formed in a first redistribution layer (RDL1) of metal in the dielectric spacer 104A (which is in a lower portion of the spacer stack 104. The ground plane 106 may be formed by deposition, paste printing, or in a variety of other ways.

At 414, through slots 112, as shown in FIG. 1 for example, are formed in the ground plane 106 of metal. The through slots 112 may be formed by etching, deposition, and/or in a variety of other ways.

At 416, an antenna element 108 is formed in the dielectric spacer stack 104 and over the ground plane 106. As shown in FIG. 1, the antenna element 108 of metal is formed in a third redistribution layer (RDL3) of metal in the dielectric spacer 104C (which is in an upper portion of the spacer stack 104. The antenna element 108 may be formed by deposition, paste printing, or in a variety of other ways.

At 418, power lines 114 of metal are formed to pass through the through slots 112 to electrically connect the chip 102 and the antenna element 108. In this way, power can be fed to the antenna element 108 from the chip 106 by the power lines 114 through the through slots 112 in the ground plane 106.

At 420, a dielectric lens 110 is formed over the antenna element 108. As shown in FIG. 1, the dielectric lens 110 is formed include a plurality of dielectric layers (such as 110A. 110B and 110C). The plurality of dielectric layers may have vertically graded dielectric constants in a decreasing order along an upward vertical direction from the antenna element 108 toward a top surface of the package 100. For example, the dielectric constant k of dielectric layer 110A of the dielectric lens 110 may be around e.g., 4.0, the dielectric constant k of dielectric layer 110B of the dielectric lens 110 may be around e.g., 3.0, and the dielectric constant k of dielectric layer 110C of the dielectric lens 110 may be around e.g., 2.2.

In addition, in some embodiments, the dielectric lens 110 is formed such that horizontal dimensions (such as lengths and widths extending in a plane perpendicular to the upward vertical direction) of the plurality of dielectric layers (such as 110A, 110B and 110C) of the dielectric lens 110 may increase along the upward vertical direction from the antenna element 108 towards the top surface of the package 100. In this way, the dielectric lens 110 is formed in a taper shape with a top side broader than a bottom side. The dielectric lens 110 thus may enhance the directivity of the on-chip antenna element 108 towards the air on the top-side. The dielectric lens 110 may also improve the interface match between air and antenna dielectric.

At 422, as shown in FIG. 1 and FIG. 3, an opening 120 is formed in a printed circuit board (PCB) 118 over the dielectric lens 110. In some embodiments, the opening 120 may be formed into the PCB 118 to expose a top surface of the dielectric lens 110. For example, as shown in FIG. 3, the opening 120 formed in the PCB 118 directly exposes the upmost dielectric layer (such as the dielectric layer 110C) of the dielectric lens 110 to the air, and thus the dielectric lens 110 of the antenna element 108 may directly meet the air to maximize the radiation of the antenna element 108 outside towards the air and to minimize the interface mismatch. As illustrated, along the direction from the antenna element 106 towards the air on the top-side of the package 100, the dielectric constants k of dielectric layers 110A, 110B, and 110C of the dielectric lens 110 may respectively be 4.0, 3.0, and 2.2, for example. That is, the graded dielectric constants k of the dielectric layers 110A, 110B, and 110C of the dielectric lens 110 are gradually reduced to approach the dielectric constant k (around 1.0) of the air. This grading of the dielectric constants k of the dielectric layers of the dielectric lens 110 may help to minimize the interface mismatch.

At 424, as shown in FIG. 3, solder bumps 322 and through mold vias 324 are formed to solder the package 100 to the PCB 118. The through mold vias may be formed by first etching channels and then filling with copper or solder, or in any of a variety of other ways.

Figure 5:
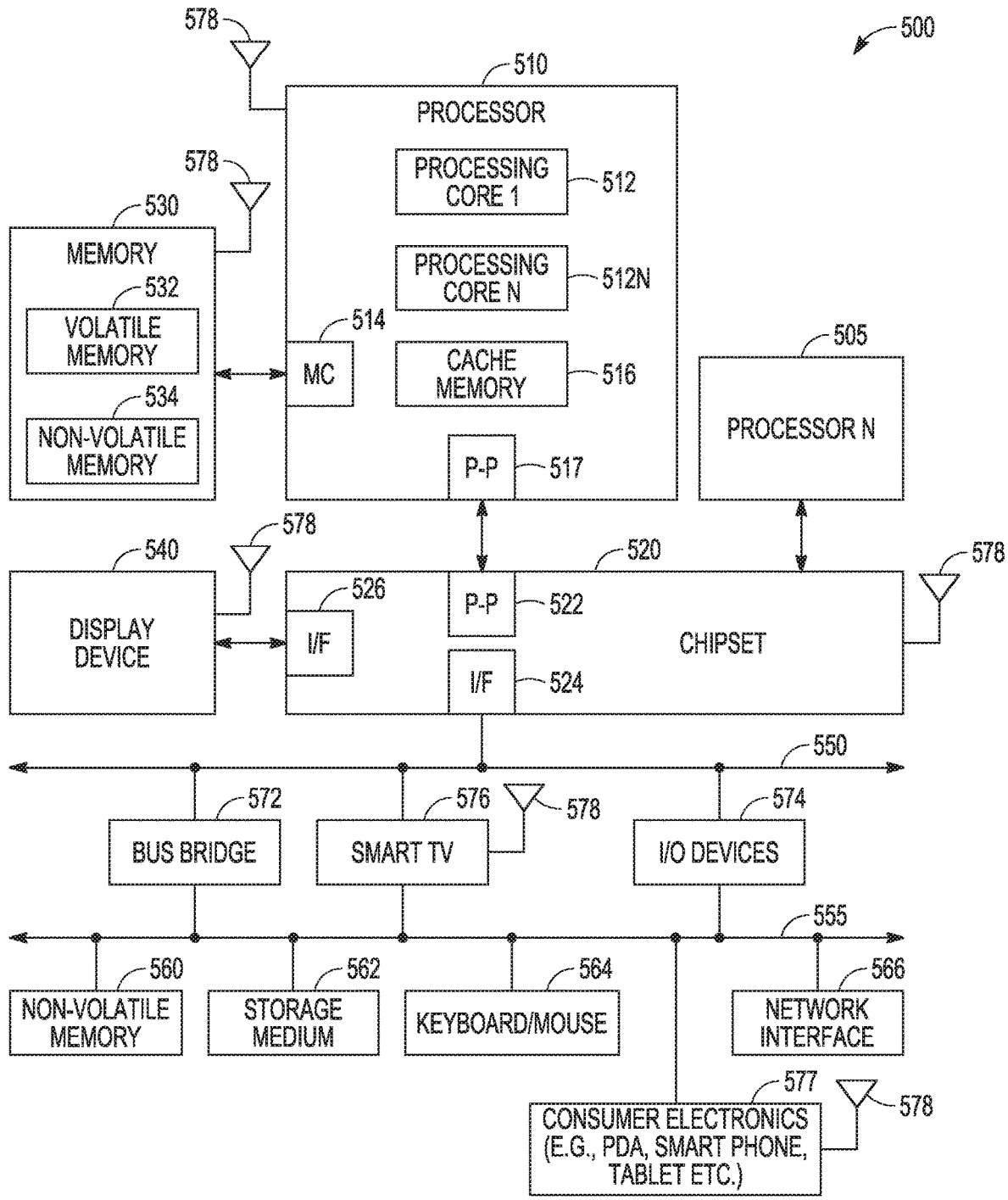
FIG. 5 is a system level diagram of an electronic device including the package according to some embodiments described herein.

FIG. 5 illustrates a system level diagram, depicting an example of an electronic device (e.g., system) including the package 100 as described in the present disclosure. FIG. 5 is included to show an example of a higher level device application for the system. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processor cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, an interface for wireless antenna 578 operates in accordance with, but is not limited to, the IEEE 802.11 standard and its related family, Home Plug AV (HPAV). Ultra Wide Band (UWB). Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM). RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the example system, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510.505N, display device 540, and other devices, including a bus bridge 572, a smart TV 576, I/O devices 574, nonvolatile memory 560, a storage medium (such as one or more mass storage devices) 562, a keyboard/mouse 564, a network interface 566, and various forms of consumer electronics 577 (such as a PDA, smart phone, tablet etc.), etc. In one embodiment, chipset 520 couples with these devices through an interface 524. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a light emitting diode (LED) array, an organic light emitting diode (OLED) array, or any other form of visual display device. In some embodiments of the example system, processor 510 and chipset 520 are merged into a single SOC. In addition, chipset 520 connects to one or more buses 550 and 555 that interconnect various system elements, such as I/O devices 574, nonvolatile memory 560, storage medium 562, a keyboard/mouse 564, and network interface 566. Buses 550 and 555 may be interconnected together via a bus bridge 572.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB)

interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB). Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

References to "an embodiment", "some embodiments", "various embodiments", etc., indicate that the embodiment(s) of the application so described may include particular features, structures, or characteristics, but not every embodiment necessarily includes the particular features, structures, or characteristics. Further, some embodiments may have some, all, or none of the features described for other embodiments.

The illustrations of the apparatus (e.g., the package 100) and the method (e.g., the method 400) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown, nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. A package comprising:
   a ground layer of metal over a chip of die;
   an antenna over the ground layer; and
   a dielectric lens over the antenna, the dielectric lens comprising a plurality of dielectric layers having graded dielectric constants along a direction from the antenna toward a top surface of the package, wherein horizontal dimensions of the plurality of dielectric layers of the dielectric lens increase along a direction from the antenna towards the top surface of the package such that the dielectric lens is in a taper shape with a top side broader than a bottom side.

2. The package of claim 1, wherein the antenna is separated from the ground layer by a stack of dielectric spacers.

3. The package of claim 2, wherein the stack of dielectric spacers comprise a same dielectric constant.

4. The package of claim 1, wherein a horizontal dimension of the ground layer of metal is greater than a horizontal dimension of the antenna.

5. The package of claim 1, wherein the dielectric constants of the plurality of dielectric layers of the dielectric lens are graded in a decreasing order along the direction from the antenna towards the top surface of the package.

6. The package of claim 1, wherein the chip comprises silicon.

7. A method of making a package, comprising: forming a stack of dielectric spacers over a die; forming a ground layer of metal in a lower portion of the stack of dielectric spacers; forming an antenna in an upper portion of the stack of dielectric spacers, the antenna separated from the ground layer by a portion of the stack of dielectric spacers; and forming a dielectric lens over the antenna, the dielectric lens comprising a plurality of dielectric layers having graded dielectric constants in a decreasing order along a direction from the antenna toward a top surface of the package wherein the dielectric lens is formed to have widths of the plurality of dielectric layers increasing along the direction from the antenna towards the top surface of the package such that the dielectric lens is in a taper shape with a top side broader than a bottom side.

8. The method of claim 7, wherein the ground layer is formed in a first redistribution layer in the lower portion of the stack of dielectric spacers, and wherein the antenna is formed in a second redistribution layer in the upper portion of the stack of dielectric spacers.

9. The method of claim 7, further comprising forming a through slot in the ground layer to allow a power line to pass through the ground layer to electrically connect the chip and the antenna.

10. The method of claim 7, further comprising forming opening into a printed circuit board over the top surface of the package to expose a top surface of the dielectric lens.

11. The method of claim 7, further comprising forming through mold vias and solder bumps to solder a printed circuit board to the package.

12. The method of claim 11, wherein forming through mold vias and solder bumps comprises:
   forming a first through mold via and a first solder bump to electrically connect the printed circuit board and a first redistribution layer in the lower portion of the stack of dielectric spacers; and forming a second through mold via and a second solder bump to electrically connect the printed circuit board and a second redistribution layer in the upper portion of the stack of dielectric spacers.

* * * * *

UNITED STATES PATENT AND TRADEMARK OFFICE
CERTIFICATE OF CORRECTION

PATENT NO. : 11,031,699 B2  
APPLICATION NO. : 15/892632  
DATED : June 8, 2021  
INVENTOR(S) : Maruthamuthu et al.

Page 1 of 1

It is certified that error appears in the above-identified patent and that said Letters Patent is hereby corrected as shown below:

In the Claims

In Column 8, Line 32, in Claim 7, after "comprising:", insert a linebreak

In Column 8, Line 33, in Claim 7, after "die;", insert a linebreak

In Column 8, Line 34, in Claim 7, after "spacers;", insert a linebreak

In Column 8, Line 37, in Claim 7, after "and", insert a linebreak

Signed and Sealed this  
Eighth Day of March, 2022

Drew Hirshfeld  
*Performing the Functions and Duties of the*  
*Under Secretary of Commerce for Intellectual Property and*  
*Director of the United States Patent and Trademark Office*